United States Patent [19]
Engh et al.

[11] Patent Number: 5,986,928
[45] Date of Patent: Nov. 16, 1999

[54] METHOD AND APPARATUS FOR DETECTING THE END OF MESSAGE RECORDED ONTO AN ARRAY OF MEMORY ELEMENTS

[75] Inventors: Lawrence D. Engh, Redwood City; Michael H. Herman, Sunnyvale, both of Calif.

[73] Assignee: Information Storage Devices, Inc., San Jose, Calif.

[21] Appl. No.: 08/924,795

[22] Filed: Sep. 5, 1997

[51] Int. Cl.[6] .................................................. G11C 11/34
[52] U.S. Cl. ............................... 365/185.03; 365/185.18
[58] Field of Search ...................... 365/45, 200, 185.18, 365/185.03

[56] References Cited

U.S. PATENT DOCUMENTS

| | | | |
|---|---|---|---|
| 5,077,691 | 12/1991 | Haddad et al. | 365/200 |
| 5,164,915 | 11/1992 | Blyth | 365/45 |
| 5,241,494 | 8/1993 | Blyth et al. | 365/45 |
| 5,751,635 | 5/1998 | Wong et al. | 365/185.19 |
| 5,805,499 | 9/1998 | Haddad | 365/185.18 |

*Primary Examiner*—David Nelms
*Assistant Examiner*—M. Tran
*Attorney, Agent, or Firm*—Blakely, Sokoloff, Taylor & Zafman LLP

[57] ABSTRACT

The present invention is a method of indicating an end of message marker in a plurality of memory cells. The method includes the step of clearing a plurality of memory cells by programming the plurality of memory cells within a first predetermined voltage range to indicate an end of message. The method further includes the step of recording an input signal onto at least a portion of the plurality of memory cells within a second predetermined voltage range. The first and second predetermined voltage ranges are non-overlapping voltage ranges.

25 Claims, 3 Drawing Sheets

METHOD AND APPARATUS FOR DETECTING THE END OF MESSAGE RECORDED ONTO AN ARRAY OF MEMORY ELEMENTS

BACKGROUND OF THE INVENTION

1. Field of the Invention

The present invention relates to the field of non-volatile integrated circuit analog signal recording and playback storage devices. More particularly, the present invention relates to detecting an end of message recorded onto an array of memory cells.

2. Description of Related Art

When an input signal is recorded onto an array of memory cells, it is necessary to determine the end of the recording during playback. FIG. 1 illustrates a typical memory array 100 for implementing a prior art end-of-message ("EOM") marker. Referring to FIG. 1, the memory array 100 has N rows and M columns and includes a plurality of dedicated EOM columns 110, typically located at both ends of the memory array 100, for storing and indicating an EOM condition. Each EOM column corresponds to a plurality of columns of memory cells (referred to as a scan) By way of example, for a 160×800 memory array, four (4) EOM columns are used, one for every two hundred columns of memory cells (e.g., two EOM columns at each end of the array). Thus, during recording of an input signal, the record operation continues to record the input signal until the end of a scan is reached. At that time, if a stop record command is detected, the recorder stops and the EOM cell corresponding to the scan just recorded is programmed to indicate an EOM condition, even though the stop record command may have been issued in the middle of the scan. However, if at the end of the scan, a record command is not detected, the record operation continues to record the input signal, without checking for a stop record command, until the end of the next scan, and so on.

During playback, the playback operation plays the input signal recorded onto the array of memory cells. At the end of a scan, the playback operation checks the EOM cell corresponding to the scan just played back and if it indicated an EOM condition, the playback operation stops. If an EOM condition is not present, the playback operation continues to play back the next scan. At the end of the next scan, the EOM cell corresponding the scan just played back is checked. If an EOM condition is present, the playback operation stops. The playback operation continues until an EOM condition is detected or the end of the memory array is reached.

This method of recording and playback is not desirable if a shorter message or more than one message is preferred. Moreover, since dedicated cells are reserved solely for the EOM marker, any imperfections in the cells may cause an error in detecting the EOM, given the fact that the chance of having a bad cell may be as low as one in one or two hundred. Therefore, it is desirable to provide a redundant method of detecting an end of message due to the fact that the array of memory cells may contain imperfections. It is further desirable to end the recording immediately after a stop command is detected. If the recording operation is allowed to continue for some time after the stop command is detected, then unwanted sounds are likely to be recorded such as the sound of the stop record switch.

Accordingly, there is a need in the art for an apparatus and method of indicating and detecting an EOM in analog storage devices or any type of multi-level storage devices.

SUMMARY OF THE INVENTION

The present invention is a method of indicating an end of message marker in a plurality of memory cells. The method includes the step of clearing a plurality of memory cells by programming the plurality of memory cells within a first predetermined voltage range to indicate an end of message. The method further includes the step of recording an input signal onto at least a portion of the plurality of memory cells within a second predetermined voltage range. The first and second predetermined voltage ranges are non-overlapping voltage ranges.

BRIEF DESCRIPTION OF THE DRAWINGS

The features and advantages of the present invention will become apparent from the following detailed description of the present invention in which.

DESCRIPTION OF THE PREFERRED EMBODIMENT

Figure 2:
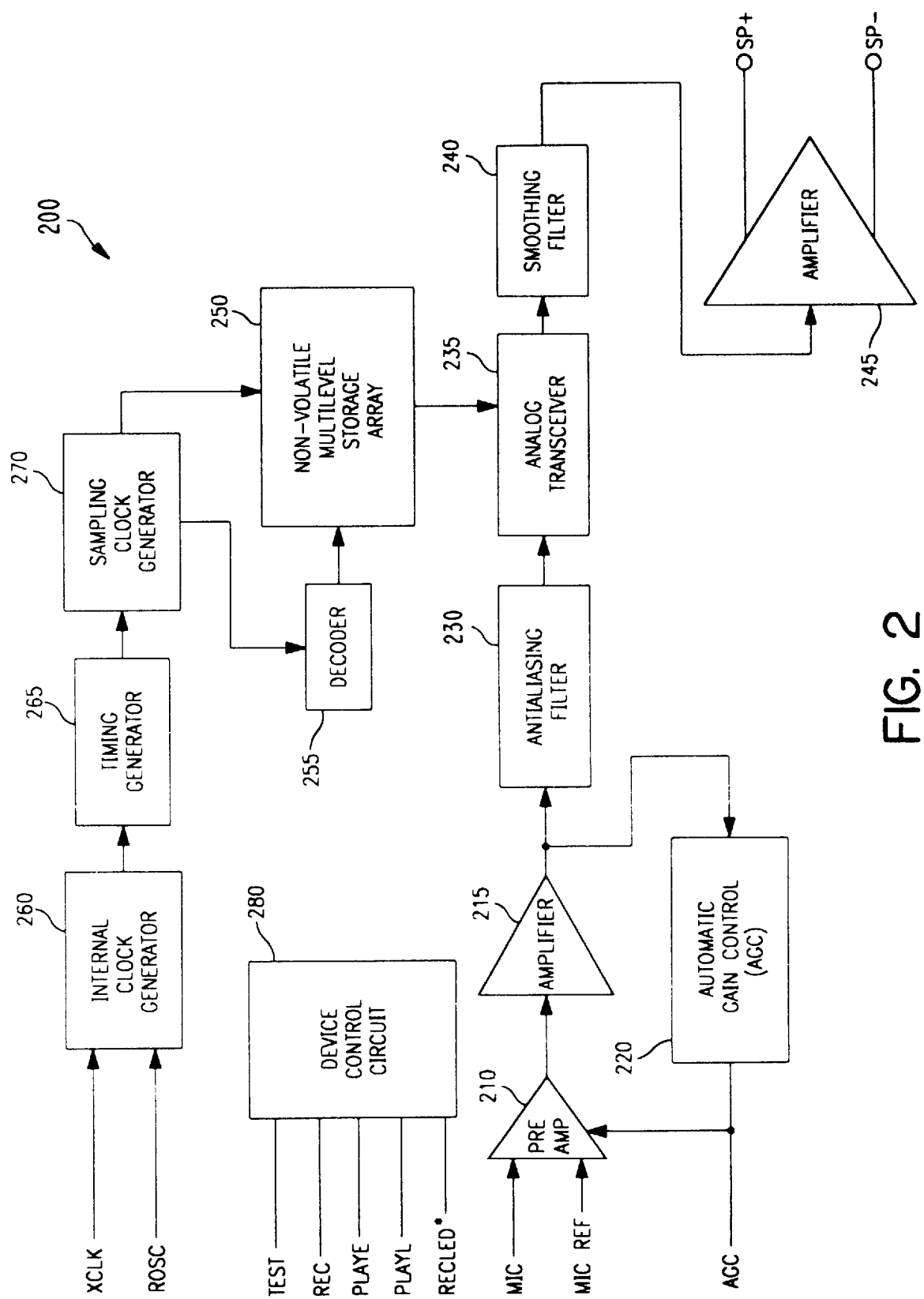
FIG. 2 is a block diagram illustrating an analog record and playback system suitable for use with the present invention.

The present invention relates to a method and apparatus for indicating and/or detecting an end of message ("EOM") recorded onto an array of non-volatile memory cells. FIG. 2 is a block diagram illustrating an analog record and playback system 200 suitable for use with the present invention. Referring to FIG. 2, the analog record and playback system 200 includes a device control circuit 280 that receives control inputs such as REC, PLAYE, PLAYL and generates a number of control signals to various circuits and outputs such as the RECLED* output for driving a light emitting diode ("LED") during a record operation. Central to the system 200 is a memory array 250 having rows and columns of non-volatile memory cells, preferably electrically erasable programmable read only memory ("EEPROM") memory cells. The memory array 250 is coupled to a decoder 255 Which provides the addressing to the memory array 250.

An internal clock generator 260 is provided and receives inputs XCLK and ROSC to generate clock signals used internally. The XCLK input provides a clock input for testing purposes and the ROSC input provide a means to vary the internal clock frequency. A timing generator 265 receives the clock signal as generated by the internal clock generator 260 to provide additional timing signals to be used in various internal control circuits A sampling clock generator 270 provides the sampling clock signal to the memory array 250 and its associated circuitry.

The system 200 includes two distinct paths, namely a record path and a playback path. The record path is for recording, writing, or storing an input (e.g., audio) signal onto the memory array 250. The playback path is for playing back, reading, or retrieving the input signal recorded onto the memory array 250. The record path comprises a preamplifier 210 which is capable of being connected to an external input transducer (e.g., a microphone), an amplifier 215, an automatic gain control ("AGC") circuit 220, an anti-aliasing filter 230, an analog transceiver 235, and the memory array 250. The playback path comprises the memory array 250, the analog transceiver 235, a smoothing filter 240, and an output amplifier 245 which is capable of being connected to an external output transducer (e.g., a speaker).

Pre-amplifier 210 amplifies an input signal (e.g., audio) from the MIC inputs. The pre-amplifier output signal is AC coupled to the second stage amplification provided by amplifier 215. The output of the amplifier 215 is fed back through the AGC circuit 220 to adjust the gain of the pre-amplifier 210 to maintain signal quality. The anti-aliasing filter 230 provides filtering function to eliminate unwanted high frequency noise which is above the voice frequency range. The analog transceiver 235 transfers the analog signal to be stored in memory array 250. The analog transceiver 235 also generates the high voltage levels required for programming, writing, and/or clearing the array of memory cells in the memory array 250.

Figure 3:
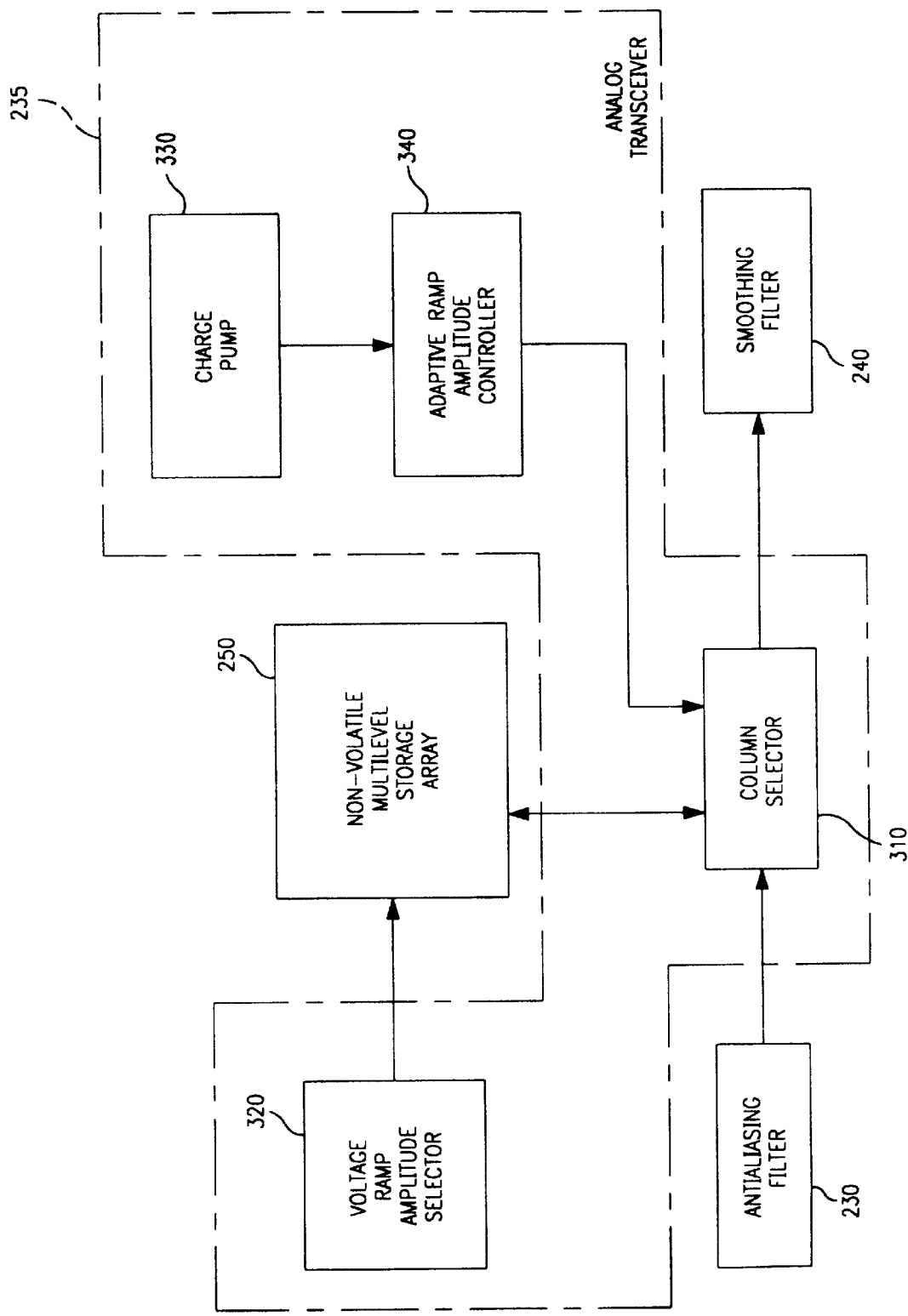
FIG. 3 is a block diagram illustrating one embodiment of the analog transceiver of FIG. 2.

FIG. 3 is a block diagram illustrating one embodiment of the analog transceiver 235 of FIG. 2. The analog transceiver 235 comprises a column selector 310, a voltage ramp amplitude selector 320, a charge pump 330, and an adaptive ramp amplitude controller 340. The column selector 310 selects the column in the storage array 250 for storing an analog signal or for reading the stored analog signal. The column selector 310 is coupled to the anti-aliasing filter 230 and the smoothing filter 240. During recording, the column selector 310 provides a signal path between the anti-aliasing filter 230 and the memory array 250. The anti-aliasing filter 230 and the smoothing filter 240 may correspond to the same filter element. The conditioned signal from the anti-aliasing filter 230 is adjusted to the appropriate voltage range to be stored in the non-volatile multi-level memory array 250.

The voltage ramp amplitude selector 320 selects an appropriate voltage ramp amplitude to adjust the programming of the non-volatile memory cells in the memory array 250. The charge pump 330 generates an appropriate high voltage level for clearing and programming the memory cells in the memory array 250. The adaptive ramp amplitude controller 340 regulates the voltage applied to the memory cells.

During playback, the column selector 310 provides a signal path between the memory array 250 and the smoothing filter 240. The input signal is provided to the smoothing filter 240 which provides additional filtering. The output amplifier 245 amplifies the smoothed analog signal to drive the speaker outputs SP+ and SP−. Thus, the input and the output paths of the system 200 of FIG. 2 provide a mechanism for translating an analog input signal from a transducer (e.g., microphone) to a signal capable of being directly stored on a memory cell without analog-to-digital conversion, as well as for translating stored analog information to a form appropriate for driving an output transducer (e.g., a speaker) without digital-to-analog conversion.

Referring back to FIG. 2, before a signal is recorded onto the memory array 250, all of the cells in the memory array 250 are placed in a fully clear state. A fully cleared memory cell can be set to be below some threshold (e.g., 0.25 volts). Thus, any memory cell that is within a first voltage range (e.g., 0.0 to 0.25 volts) is treated as a cleared cell. During a record operation, each cell in the memory array 250 is programmed to a signal voltage within a second voltage range. In the preferred embodiment, the second voltage range is 0.5 to 2.5 volts. However, other voltage ranges may be used such as 1 to 3 volts or 0.5 to 4 volts. It is to be noted that the first and second voltage ranges must not overlap in order to distinguish a fully cleared cell from a cell that is programmed with an input signal.

For a single message part, the entire array can be cleared before the record begins. The record operation can fill the entire memory array 250 with an input signal or it can be stopped at any location before the end of the memory array. This allows any part of the array which was not recorded to cause an end of message condition. During playback of an input signal recorded, the playback operation is stopped when at least one fully cleared cell (i.e., an EOM condition) is detected or when the last cell in the memory array 250 is reached. For a system which allows more than one message to be recorded onto an array of memory cells, a sufficient block of consecutive cleared cells (e.g., 3) between messages may be used to indicate an end of message condition. For the case where a message ends exactly at the end of a row, then the next row can be left cleared to indicate the end of message.

In one embodiment, the record operation writes one cell at a time. If the stop record signal is received before the end of the array, then no new samples are stored onto the array. The balance of the array is left fully cleared for single message operation. During playback the output of the array is compared to the voltage reference level which distinguishes a cleared cell (e.g., 0.0 to 0.25 volts) from a programmed cell (e.g., 0.5 to 2.5 volts). When one or more consecutive cleared cells are detected, the playback operation is terminated. After one cleared cell is detected, the output signal path is muted in anticipation of the end of message.

Figure 1:
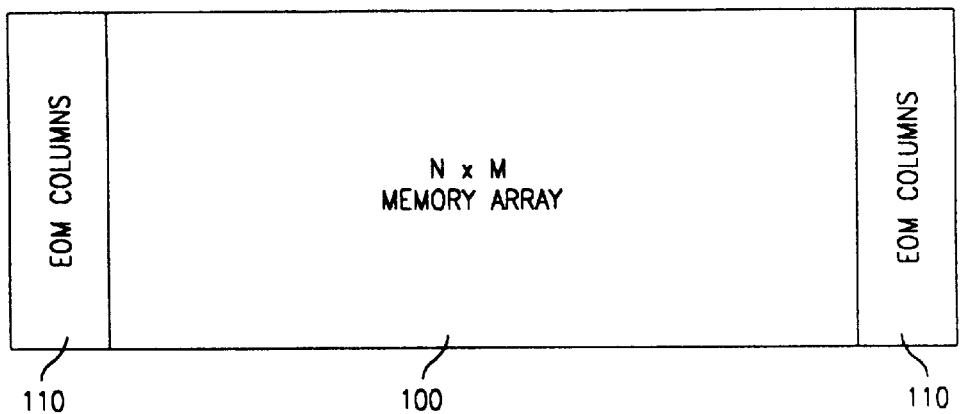
FIG. 1 illustrates a memory array for implementing a prior art end-of-message ("EOM") marker.
Figure 4:
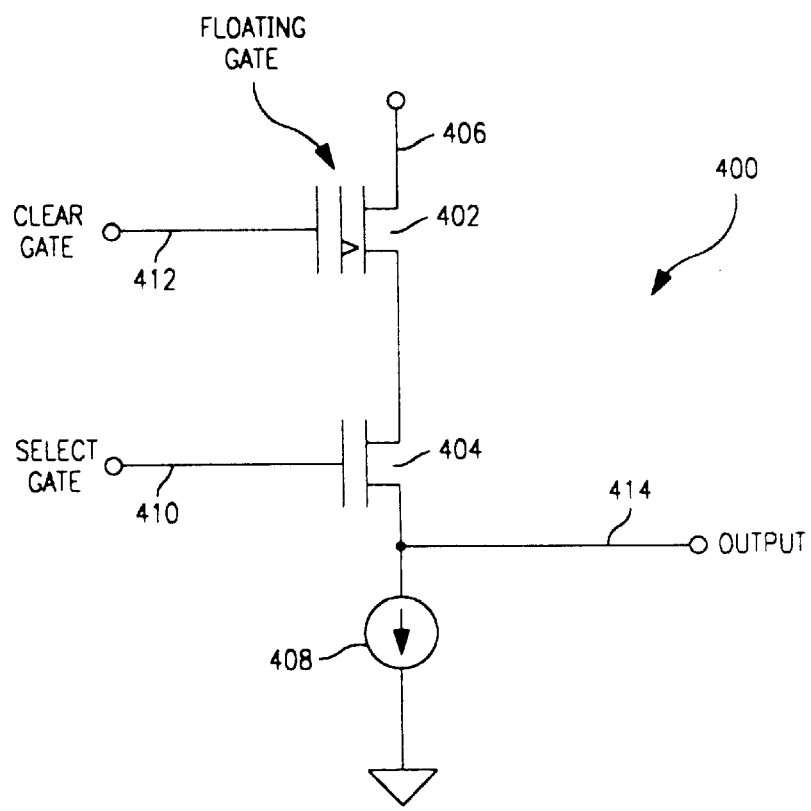
FIG. 4 illustrates a memory cell of the memory array of FIG. 2 configured in the read mode.

FIG. 4 illustrates a memory cell 400 of the memory array 250 of FIG. 2 configured in the read mode. The memory cell 400 includes a floating gate device 402 and a select device 404. In the playback mode, the voltage on the select gate 410 is large enough that the select device 404 acts as an on switch. All other rows in the memory array 250 of FIG. 2 are disabled by applying zero volts on the select gate of the select devices of the disabled rows (not shown). The voltage on the clear gate 412 is held to about 3.5 volts as is the terminal 406, which is biased as the drain in the read mole. The read output voltage on the output terminal 414 is selected by switches which are not shown to isolate a single cell. In addition, in the read mode, the memory cell 400 provides a current load 408 to produce the read output voltage which depends linearly upon the voltage stored on the floating gate of the floating gate device 402. In one embodiment, the load current has a compliance voltage range which is from 0 to 3.5 volts.

A fully cleared transistor has a large negative voltage stored on the floating gate which holds the transistor off, thereby yielding a read output voltage of about zero volts. This is the condition that each cell of the memory array 250 of FIG. 2 is placed into before programming an input signal onto the memory array. In one embodiment, the lowest voltage that a cell can be written to (with an input signal) is a nominal 0.5 volts. Thus, by placing a detection circuit onto the output terminal 314, set to the upper limit of a fully cleared cell (e.g., 0.25 volts), a programmed cell can be distinguished from a cleared cell.

In the preferred embodiment, the memory cell 400 is a multilevel non-volatile analog storage cells. A multi-level analog storage cell is a storage cell that can be programmed at one of a plurality of voltage levels. In one embodiment, the memory cell 400 is capable of being programmed at one of 256 voltage levels, corresponding to 8 bits of digital data. In another embodiment, the memory cell 400 is capable of being programmed at one of 16 voltage levels, corresponding to 4 bits of digital data. It is also contemplated that the storage cells may be digital storage cells.

It must be noted that a single memory cell, used as an EOM marker, can lead to run-on messages or an incorrect ending of the message during playback if the cell is bad or otherwise fails. In particular, a memory cell that is given a very large electronic charge (either positive or negative) in order to denote an EOM to the playback circuitry, can eventually lose some of this charge and appear to have a signal that is part of the recorded message. Solid-state memory cells such as erasable programmable read only memory ("EPROM") cells or electrically erasable programmable read only memory ("EEPROM") cells can lose charge and eventually fail over time due to several mechanisms. Among the causes of time dependent charge loss in EPROM and EEPROM semiconductor memories are oxide breakdown, mobile ion contamination, stress-induced leakage currents, and field emission from asperities.

Other reasons for an EOM cell failure may be independent of time. For example, there may be insufficient initial charge placed on the memory cell itself, which can be caused by electrical leakage between physically adjacent memory cells. Due to the random and unpredictable failures of memory cells, the failure of a single memory cell can result in a run-on message or an incorrect ending of the message. In the former case, the playback of a message is not stopped by the EOM detection circuit and continues to playback the next message stored in the memory array, whereas in the latter case, an incorrect ending of a message leaves the balance of the message impossible to play back.

To overcome these possible situations, the criteria for ending a playback may be altered to detect more than one fully cleared (i.e., EOM) cell. In one preferred embodiment, three consecutive fully cleared cells detected indicates an end of message and causes the playback operation to terminate. Obviously, any other number could be selected such as two or four, as well as various voting functions for the larger numbers. As such, single bad cells in an array can be tolerated. For a multi-message system (i.e., a system which allows more than one message to be recorded onto an array of memory cells), the criteria for an EOM may be three consecutive EOM cells between messages. Other criteria may be used for a multi-message system such as leaving or clearing a plurality of EOM memory cells (e.g., 6) between messages during programming and detecting less than the plurality of EOM cells (e.g., 3) during playback to stop the playback operation. Yet another criteria for a multi-message system may be to leave or clear an entire row or block of EOM cells between messages.

It is assumed that the probability of an eventual failure of a single memory cell is P (where P<1). For example, P may be one failure in 1,000 memory cells, or $0.001=10^{-3}$. This also corresponds to a failure rate of 1,000 parts per million ("ppm"), an unacceptably high value. If the criteria for indicating an EOM is two cells which are time-adjacent (sequentially occurring) during the recording cycle, but requires only one such EOM cell signal to stop the message, the probability of an error is reduced to the product of P×P, or $p^2$ (assuming that the probability of failure for each cell is independent). In the example above, this becomes $10^{-6}$ or 1 ppm, a more acceptable value.

However, even requiring two time-adjacent memory cells to indicate an EOM may still have insufficient reliability. One of the reasons is that the memory cells may be physically-adjacent as well as time-adjacent. Processing flaws due to lithography or etching in semiconductor memories can cause two memory cells to be linked electrically together. In EPROM or EEPROM cells, for example, the floating gates of two physically adjacent cells can be electrically shorted. Thus, if one cell is defective, the adjacent cell will also be defective. The use of a single pair of memory cells for action as a single EOM signal can have higher failure rate than the $p^2$ value estimated above.

The use of three or more time-adjacent memory cells for the EOM marker gives improved reliability and minimizes cost over alternatives. The probability of failure, assuming that the probability of failure for each cell is independent, for three cells is $p^3$, which becomes, in the above example, $10^{-9}$ or 0.001 ppm. More importantly, if a defect with probability P2 (P2<1) links two physically adjacent cells out of the triad, the failure rate becomes P2×P. Assuming that the probability of two memory cells being shorted together is 1 in 10,000 or 100 ppm, the combined product of the charge loss probability P ($10^{-3}$) and the physical defect probability P2 ($10^{-4}$) gives the overall failure rate of $10^{-7}$ or 0.1 ppm. Thus, the use of 3 time-adjacent memory cells minimizes the number of memory cells required, yet substantially eliminates both physical and charge loss defects, for very high reliability of the EOM marker.

Thus, what has been described is a method and apparatus for indicating and/or detecting an EOM recorded onto an array of memory cells. The advantage of the present invention is that a message recorded onto a memory array can stop at any location in the memory array as soon as a stop record command is detected. The next one or more location in the memory array indicates an EOM. During playback of the message, the playback operation stops playback of the message when the one or more EOM cells are detected. By restricting the input signal to be recorded onto a memory array to be within a first voltage range and a cleared cell to be within a second, non-overlapping voltage range, a programmed memory cell can be distinguished from a cleared memory cell.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method of indicating an end of message in a plurality of analog memory cells, comprising:

programming each of the plurality of memory cells within a first predetermined voltage range;

programming samples of an input signal onto at least a portion of the plurality of memory cells within a second predetermined voltage range, the first and second predetermined voltage ranges being non-overlapping voltage ranges; and reading the samples of the input signal from the memory cells until at least one memory cell that is within the first predetermined voltage range is detected.

2. The method of claim 1 wherein programming the samples of the input signal comprises programming the samples of the input signal onto at least a portion of the plurality of memory cells between 0.5 to 2.5 volts.

3. The method of claim 2 wherein programming each of the plurality of memory cells comprises programming each of the plurality of memory cells between 0.0 to 0.25 volts.

4. The method of claim 1 wherein reading the samples of the input signal from the memory cells comprises reading the samples of the input signal from the memory cells until at least three or more consecutive memory cells that are within the first predetermined voltage range are detected.

5. The method of claim 1 wherein reading the samples of the input signal from the memory cells comprises reading the samples of the input signal from the memory cells until at least one memory cells that is within the first predetermined voltage range is detected or the end of the plurality of memory cells is reached.

6. The method of claim 1 further comprising programming samples of a second input signal onto at least a second portion of the plurality of memory cells within the second predetermined voltage range, the second portion of the plurality of memory cells starting at a point at least two memory cells after the portion of the plurality of memory cells.

7. The method of claim 6 further comprising reading the samples of the second input signal from the memory cells until at least one memory cell that is within the first predetermined voltage range is reached.

8. The method of claim 1 further comprising programming samples of a second input signal onto at least a second portion of the plurality of memory cells within the second predetermined voltage range, the second portion of the plurality of memory cells starting at a point four memory cells after the portion of the plurality of memory cells.

9. An apparatus for indicating an end of message, comprising:

a plurality of memory cells to be programmed with samples of an input signal within a first predetermined voltage range;

at least one additional memory cell to be programmed within a second predetermined voltage range, the first and second predetermined voltage ranges being non-overlapping voltage ranges; and a circuit to read the samples of the input signal for playback, the circuit to stop reading when the at least one additional memory cell that is within the second predetermined voltage range is detected.

10. The apparatus of claim 9 wherein the first predetermined voltage range is between 0.5 to 2.5 volts.

11. The apparatus of claim 9 wherein the second predetermined voltage range is between 0.0 to 0.25 volts.

12. The apparatus of claim 9 wherein the circuit to stop reading when three consecutive memory cells that are within the second predetermined voltage range are detected.

13. The apparatus of claim 9 wherein each of the memory cells are analog memory cells.

14. The apparatus of claim 9 wherein the at least one additional memory cell immediately follow the plurality of memory cells.

15. The apparatus of claim 9 wherein each of the memory cells is a non-volatile memory cell.

16. The apparatus of claim 15 wherein each of the memory cells is a multi-level non-volatile memory cell.

17. A recording and playback system, comprising:

an input path to receive a signal and provide samples thereof for recording;

a memory array including rows and columns of memory cells, the memory array to store the samples of the signal onto at least a portion thereof within a first predetermined voltage range, at least one memory cell in a remainder of memory cells in the memory array to store a voltage that is within a second predetermined voltage range, wherein the first and second predetermined voltage ranges are non-overlapping voltage ranges; and an output path to retrieve the samples of the signal for playback until at least one memory cell that is within the second predetermined voltage range is detected.

18. The system of claim 17 wherein the first predetermined voltage range is between 0.5 to 2.5 volts and the second predetermined voltage range is between 0.0 to 0.25 volts.

19. The system of claim 17 wherein the input path comprises:

a pre-amplifier for coupling to an input transducer;

an amplifier coupled to the pre-amplifier;

an automatic gain control circuit coupled to the amplifier;

an anti-aliasing filter coupled to the automatic gain control circuit; and a transceiver coupled to the anti-aliasing filter and the memory array.

20. The system of claim 17 wherein the output path comprises:

a transceiver coupled to the memory array;

a smoothing filter coupled to the transceiver; and an amplifier for coupling to an output transducer.

21. The system of claim 17 wherein at most each memory cell in the remainder of memory cells in the memory array to store a voltage that is within the second predetermined voltage range.

22. The system of claim 17 wherein the memory array is an analog non-volatile memory array.

23. A method of indicating an end of message, comprising:

erasing a plurality of memory cells by programming each of the memory cells within a first predetermined voltage range;

recording samples of an input signal onto at least a portion of the plurality of memory cells within a second predetermined voltage range, the first and second predetermined voltage ranges being non-overlapping voltage ranges; and playing back the samples of the input signal from the memory cells until at least one memory cell that is within the first predetermined voltage range is detected.

24. The method of claim 23 wherein erasing the plurality of memory cells comprises erasing the plurality of memory cells by programming each of the memory cells between 0.0 and 0.25 volts, and wherein recording the samples of the input signal comprises recording the samples of the input signal onto at least a portion of the plurality of memory cells between 0.5 and 2.5 volts.

25. The method of claim 23 wherein the plurality of memory cells are multi-level non-volatile memory cells.

* * * * *